US010837088B2

(12) United States Patent
Kathrein et al.

(10) Patent No.: US 10,837,088 B2
(45) Date of Patent: Nov. 17, 2020

(54) COATING MATERIAL (71) Applicant: PLANSEE SE, Reutte (AT)

(72) Inventors: Martin Kathrein, Reutte (AT); Michael O'Sullivan, Ehenbichl (AT)

(73) Assignee: Plansee SE, Reute (AT)

( * ) Notice: Subject to any disclaimer, the term of this patent is extended or adjusted under 35 U.S.C. 154(b) by 616 days.

(21) Appl. No.: 15/106,396

(22) PCT Filed: Dec. 17, 2014

(86) PCT No.: PCT/AT2014/000226
§ 371 (c)(1),
(2) Date: Jun. 20, 2016

(87) PCT Pub. No.: WO2015/089534
PCT Pub. Date: Jun. 25, 2015

(65) Prior Publication Data
US 2017/0002444 A1  Jan. 5, 2017

(30) Foreign Application Priority Data
Dec. 20, 2013 (AT) .................. GM458/2013

(51) Int. Cl.
C22C 27/06 (2006.01)
C23C 24/04 (2006.01)
B22F 9/22 (2006.01)
B22F 1/00 (2006.01)
C23C 4/11 (2016.01)
C23C 14/14 (2006.01)
C23C 4/073 (2016.01)
C23C 4/129 (2016.01)
C22C 19/05 (2006.01)
C23C 24/08 (2006.01)

(52) U.S. Cl.
CPC .......... C22C 27/06 (2013.01); B22F 1/0003 (2013.01); B22F 1/0011 (2013.01); B22F 1/0096 (2013.01); B22F 9/22 (2013.01); C22C 19/058 (2013.01); C23C 4/073 (2016.01); C23C 4/11 (2016.01); C23C 4/129 (2016.01); C23C 14/14 (2013.01); C23C 24/04 (2013.01); C23C 24/087 (2013.01); B22F 2301/20 (2013.01); B22F 2998/10 (2013.01)

(58) Field of Classification Search
CPC ................................................. C22C 27/06
See application file for complete search history.

(56) References Cited

U.S. PATENT DOCUMENTS

| 4,148,628 | A | 4/1979 | Fukunishi et al. |
| 6,346,134 | B1 | 2/2002 | Russo et al. |
| 6,627,814 | B1 | 9/2003 | Stark |
| 7,160,352 | B2 | 1/2007 | Le Biez et al. |
| 8,697,184 | B2 | 4/2014 | Hertter et al. |
| 9,222,164 | B2 | 12/2015 | Helmick et al. |
| 2009/0208775 | A1* | 8/2009 | Payne ............ F01D 5/288 428/668 |
| 2010/0015467 | A1* | 1/2010 | Zimmermann ........ B22F 7/08 428/615 |
| 2012/0180747 | A1 | 7/2012 | Domanchuk et al. |
| 2013/0220523 | A1 | 8/2013 | Cheney et al. |
| 2016/0199910 | A1 | 7/2016 | O'Sullivan et al. |

FOREIGN PATENT DOCUMENTS

| CN | 105517736 A | 4/2016 |
| DE | 2807034 A1 | 8/1978 |
| DE | 102008056720 B3 | 5/2010 |
| DE | 102009033620 A1 | 1/2011 |
| GB | 512502 | 9/1939 |
| GB | 2255349 A | 11/1992 |
| JP | S53124108 A | 10/1978 |
| JP | S5413408 A | 1/1979 |
| JP | 04165058 A | 6/1992 |
| JP | 04165058 A * | 6/1992 |
| JP | 06081052 A | 3/1994 |
| JP | 07216474 A | 8/1995 |
| JP | 2006022358 A | 1/2006 |
| JP | 3934686 B2 | 6/2007 |
| JP | 2008255487 A | 10/2008 |
| JP | 2011132565 A | 7/2011 |
| RU | 2342222 C2 | 12/2008 |
| WO | 0172455 A1 | 10/2001 |
| WO | 2008057710 A2 | 5/2008 |
| WO | 2012026898 A1 | 3/2012 |
| WO | 2012097983 A1 | 7/2012 |
| WO | 2015027256 A2 | 3/2015 |

OTHER PUBLICATIONS

Espacenet machine translation of JPH04165058, generated Sep. 18, 2018 (Year: 2018).*
Sully, A.H., "Chromium, Metallurgy of the rarer metals", 1954, pp. 16-63, vol. 1, Butterworths Scientific Publications, London, UK.
Shvedkov E. I. et al. "Slovar-spravochnik po poroshkovoy metal-lurgii" (Dictionary-directory on powder metallurgy), Kiev, Naukova dumka, 1982, pp. 11, 88—English translation.

* cited by examiner

Primary Examiner — Christopher S Kessler
(74) Attorney, Agent, or Firm — Laurence A. Greenberg; Werner H. Stemer; Ralph E. Locher (57) ABSTRACT A coating material has Cr-rich regions having a Cr content >95% by mass which form Cr-containing particles. At least some of these particles are present in the form of aggregates or agglomerates, at least some have pores and have in the Cr-rich regions a mean nanohardness $HIT_{0.005/5/1/5}$ of ≤4 GPa and/or a mean surface area, measured by BET, >0.05 m²/g. The coating material is particularly suitable for cold gas spraying. There is also described a process for the production of a coating, and to a coating produced by the process.

16 Claims, 3 Drawing Sheets

COATING MATERIAL

BACKGROUND OF THE INVENTION

Field of the Invention

The invention relates to a coating material comprising chromium (Cr)-rich regions having a Cr content >95% by mass which form Cr-containing particles. The invention relates further to a process for the production of a coating, and to a coating.

Coating materials conventionally in powder or granule form are preferably used for thermal spraying processes. Thermal spraying processes include, for example, plasma spraying (atmospheric, under protecting gas or under low pressure), powder flame spraying, high-velocity flame spraying (HVOF, derived from High-Velocity-Oxygen-Fuel), detonation spraying (shock-wave flame spraying), laser spraying and cold gas spraying (CGS). A common feature of all thermal spraying processes is the interaction of thermal energy and kinetic energy. The coating material is heated in a spray burner (thermal energy) and/or accelerated to high velocities (kinetic energy). In cold gas spraying, for example, a process gas (mostly $N_2$, He or mixtures thereof) which has been brought to high pressure and heated is expanded by means of a convergent-divergent nozzle (also referred to as a supersonic nozzle). A typical form of nozzle is the Laval nozzle (also called the De Laval nozzle). The kinetic energy required for the spraying process is thereby generated. Depending on the process gas used, gas velocities of from 900 m/s (in the case of nitrogen) to 2500 m/s (in the case of helium) can be achieved. The coating material is introduced into the gas stream upstream of the narrowest cross-section of the nozzle, for example, and typically accelerated to from 400 to 1200 m/s. Dense coatings having very good adhesion properties can be produced with many materials by cold gas spraying. The gas temperature is very low compared with other spraying processes. Consequently, the thermal energy of the spray particles is also greatly reduced, which decreases reactions with gases. However, the properties of the coating material have a significant influence on the coating process and accordingly on the quality of the coating that is deposited.

In thermally sprayed coatings, the coatings are built up layer-wise from the individual particles of the coating material. Lateral spreading of the heated particles occurs upon impact on the substrate surface. The impacting particles form a closed coating which, depending on the properties of the coating material, can be traversed by pores and microcracks.

For the quality of a thermally sprayed layer, the adhesion of the coating material to the substrate material and the cohesion between the particles of the coating material are critical. In principle, the adhesion of thermally sprayed coatings is an interaction of a plurality of physical and chemical adhesion mechanisms, which are dependent on the particle velocity (kinetic energy), the particle temperature (thermal energy) and the substrate properties such as, for example, the material composition, roughness and surface temperature. In the case of cold gas spraying, a further criterion is that the particles leave the spray nozzle at a comparatively low temperature. In the case of coating materials having a high yield strength/elastic limit, this can be associated with insufficient flowability, as a result of which coating build-up is not possible. The above-described requirements of a coating, such as coating adhesion, low porosity, high grain boundary strength and coating ductility, are satisfied by different coating materials to differing degrees. A coating material which is particularly difficult to process is chromium.

The large-scale production of chromium metal powder from chromium oxides is at present carried out only by aluminothermic and electrolytic processes. However, powders produced in that manner have poor spray behaviour, in particular in the case of a low thermal energy component. In addition, electrolytic processes are harmful to the environment owing to the use of Cr(VI) compounds. Increasingly stricter environmental specifications mean that this process is scarcely justifiable economically and in terms of the environment.

In addition to the aluminothermic and electrolytic processes, attempts have also been made to reduce chromium oxide with hydrogen or carbon, as is disclosed in the publication "Metallurgy of the Rarer Metals—Chromium"; Arthur Henry Sully; Butterworths Scientific Publications (1954) and in patents or patent applications GB 512,502, JP 54013408 A, JP 07216474 A, JP 3934686 B2 and JP 06081052 A. It has been found, however, that the described processes are not suitable for conversion to a large scale.

Thus, it has not hitherto been possible to produce dense, strongly adherent, cold-gas-sprayed coatings using the known Cr powders. Although a cold-gas-sprayed layer of Cr, in a list with W, Mo, Ti, Zr, Ni, Co, Fe, Al, Ag, Cu or alloys thereof, having an O content <500 ppm and an H content <500 ppm is disclosed in WO 2008/057710 (A2), a technical conversion could be achieved only with the more ductile materials, such as, for example, Ti, Zr, Ni, Co, Fe, Al, Ag and Cu. At the time of the application for the invention, the general opinion among experts is that, because of the high yield strength, the high work hardening and the brittleness of Cr, cold-gas-sprayed Cr coatings cannot be produced.

This is one reason why the largest proportion of Cr-containing coatings continue to be deposited galvanically. As a result of the poor degree of efficiency and the high currents, hydrogen and oxygen form during chromium plating. The chromium bath is finely atomized by bursting bubbles. Because of the high risk of cancer from chromium (VI), the chromium baths must therefore be suction cleaned and the formation of chromium aerosols suppressed. For this reason, therefore, there is great interest in moving away from environmentally problematic Cr electroplating. In addition, a hard chromium coating contains a tight network of very fine cracks, which run approximately perpendicular to the surface. The formation of these cracks is closely associated with the hydrogen outgassed during the deposition. Some of the hydrogen is temporarily incorporated into the chromium coating in the form of chromium hydride. When the chromium hydride subsequently decomposes, shrinkage of the chromium coating occurs and the resulting tensile stresses lead to cracks, which in turn reduces the corrosion protection properties.

BRIEF SUMMARY OF THE INVENTION

The object of the invention is, therefore, to provide a Cr-containing coating material with which Cr-containing coatings, in particular having a high Cr content, with good coating adhesion and high density can reliably be produced by thermal coating processes, in particular by cold gas spraying. A further object of the invention is to provide a process for the production of a strongly adherent Cr-containing coating with high density, which is as free as possible of cracks running approximately perpendicular to the surface. A further object is to provide a coating having a high Cr content which is produced by cold gas spraying.

The object is achieved by the independent claims. Particular embodiments are described in the dependent claims.

The coating material is preferably in powder or granule form. Powder is understood as meaning a plurality of particles, wherein a particle can in turn consist of primary particles and secondary particles bonded thereto. If the particle size is small, it can be advantageous for the spraying process to convert a plurality of powder particles, which in turn consist of primary and secondary particles, into powder granules. A powder granule particle can therefore consist of a plurality of particles. These particles can be bonded together by material bonding with or without the presence of one or more further constituents. The size of the powder particles or powder granule particles is referred to as the particle size and is conventionally measured by means of laser diffractometry. The measurement results are given as a distribution curve. The $d_{50}$ value thereby indicates the mean particle size. $d_{50}$ means that 50% of the particles are smaller than the indicated value.

The coating material comprises Cr-rich regions having a Cr content >95% by mass. The Cr-rich regions consist at least in part of a Cr-rich phase. Cr-rich region and Cr-rich phase are used synonymously in the following. A Cr-rich phase having a Cr content >95% by mass means that the proportion of dissolved elements is ≤5% by mass. Preferably, the majority (>70% by mass, in particular >80% by mass, most particularly >90% by mass) of the Cr contained in the coating material is present in the form of Cr-rich phase having a Cr content >95% by mass. Other phase constituents can be incorporated into the Cr-rich phase. These are not taken into account when evaluating the Cr content in the Cr-rich phase. If the content of dissolved elements is >5% by mass (Cr content <95% by mass), the hardness of these regions is too high, which has a negative effect on the spray behaviour. The Cr-rich regions form particles (also called Cr-containing particles or simply particles in the following).

It is fundamental to the invention that the coating material satisfies at least one of the following conditions:

At least some of the Cr-containing particles are present in the form of aggregates or agglomerates.
At least some of the Cr-containing particles have pores.
The Cr-rich regions have a mean nanohardness $H_{IT\ 0.005/5/1/5}$ of ≤4 GPa.
The Cr-containing particles have a mean surface area, measured by means of BET, >0.05 m²/g.

It has been shown that advantageous coatings can be produced even when only one of these conditions is satisfied. Particularly advantageous coatings can be produced when two conditions, in particular when three or all four conditions, are satisfied. These features and the influence of these features on the coating process are discussed in detail in the following.

As mentioned, at least some of the Cr-containing particles are advantageously present in the form of aggregates or agglomerates. In powder metallurgy, an aggregate is understood as being a cluster of primary particles which are bonded together by a strong bond, while in an agglomerate, a cluster of primary particles are bonded together by a weak bond (see, for example, German, R.: "Introduction to Powder Metallurgy Science", MPIF, Princeton (1984) 32). In the following, an aggregate denotes a cluster which cannot be broken up by conventional ultrasonic deagglomeration, while agglomerates can be divided at least partially into the primary particles. Ultrasonic deagglomeration is thereby carried out at 20 kHz and 600 W. The coating material is advantageously present in the form of an aggregate, as is also apparent from the examples. Bonding between the Cr-containing primary particles is thereby material bonding (metallurgical bonding), preferably without the involvement of other elements. Particularly advantageously, >20%, in particular >50%, of all the particles are present in the form of an aggregate or agglomerate. The evaluation is carried out as follows. 5 samples are taken, which are analyzed by means of a scanning electron microscope. At a magnification which includes from 20 to 50 particles in the image section, it is possible to determine in a simple manner whether the particle is present in aggregate/agglomerate form or not. The number of particles present in aggregate/agglomerate form is determined, based on the total number of evaluated particles, and the mean of the five samples is calculated.

It is further advantageous if the Cr-containing particles have a mean nanohardness $H_{IT\ 0.005/5/1/5}$ of ≤4 GPa. The nanohardness $H_{IT\ 0.005/5/1/5}$ is determined in accordance with EN ISO 14577-1 (2002 edition) using a Berkovich indenter and the evaluation method according to Oliver and Pharr. The hardness value relates to a powder or powder granules which is/are preferably not subjected to additional after-treatment, such as, for example, annealing. The nanohardness is preferably ≤3.5 GPa. In the case of very high requirements, a nanohardness $H_{IT\ 0.005/5/1/5}$ of ≤3 GPa is advantageous. In the case of very pure Cr phase, it is possible to produce metal powders having a nanohardness $H_{IT\ 0.005/5/1/5}$ of approximately 1.5 GPa. In order to determine the nanohardness, a powder section is prepared and the nanohardness is determined on the polished cross-sectional surface of the particles.

It is further advantageous if at least some of the Cr-containing particles have pores. Particularly advantageously, >20%, in particular >50%, of all the particles have pores. The evaluation is made by a scanning electron microscopic investigation as described above for the feature aggregate/agglomerate.

Furthermore, the particles preferably have a mean porosity, determined by means of quantitative image analysis, >10% by volume. Particularly preferably, the mean porosity of the particles is >20% by volume, particularly preferably >40% by volume. It has been possible to achieve values of 85% by volume and above. Preferred ranges for the porosity P are 10% by volume <P<85% by volume, 20% by volume <P<85% by volume, or 40% by volume <P<85% by volume. The determination of the mean porosity is carried out by the following procedure. Powder sections are first prepared. To that end, the powder is embedded in epoxy resin. After a curing time of 8 hours, the samples are prepared metallographically, that is to say an analysis over the powder cross-section can subsequently be carried out. The preparation comprises the steps: grinding at from 150 to 240 N with firmly bonded SiC paper of grit sizes 800, 1000 and 1200; polishing with diamond suspensions of 3 μm grain size; final polishing with an OPS (oxide polishing suspension) of grain size 0.04 μm; cleaning the samples in an ultrasonic bath and drying the samples. Ten images of different, representative particles are then prepared for each sample. This is carried out by means of scanning electron microscopy using a 4-quadrant annular detector to detect back-scattered electrons (BSE). The excitation voltage is 20 kV, the tilt angle is 0°. The images are focused. The resolution should be at least 1024×768 pixels for correct image analysis. The contrast is so chosen that the pores clearly stand out from the metallic matrix. The magnification for the images is so chosen that each image contains one particle. The quantitative image analysis is carried out using Image Access software. The "Particle Analysis" module is used. Each image analysis follows the steps: setting a grey level threshold so that open pore volume in the grains is detected; fixing the measure frame, in this case a circle/rectangle of maximum size within a grain (area 0.02-0.5 mm$^2$); detection setting: measurement only in ROI, inclusion of the image edge, cropping of ROI by object. Filter functions are not used either during acquisition or during analysis of the images. Because the pores in a back-scattered electron image appear darker than the metallic matrix, the "dark objects" are defined as pores in the detection setting. Once the 10 images have been analyzed, a statistical evaluation is carried out over the data. The mean proportion by surface area of the pores (%) is determined therefrom, which can be equated with the mean porosity in percent by volume.

The pores according to the invention are preferably at least partially open pores. Open pores are to be understood as being pores which are connected to the surface by pore channels. The proportion by volume of open pores, based on the total porosity, is advantageously >30% by volume, very advantageously >50% by volume, preferably >70% by volume and particularly preferably >90% by volume. The open pores are in turn preferably linked to one another.

The advantageous, preferably open porosity and/or the powder form (aggregates or agglomerates) also contribute to a very high specific BET surface area of the Cr-containing particles, advantageously of >0.05 m$^2$/g. The BET measurement is carried out in accordance with standard (ISO 9277: 1995, measuring range: 0.01-300 m$^2$/g; instrument: Gemini II 2370, heating temperature: 130° C., heating time: 2 hours, adsorptive: nitrogen, volumetric evaluation by five-point determination). Further preferred embodiments are: BET surface area ≥0.06 m$^2$/g, ≥0.07 m$^2$/g, ≥0.08 m$^2$/g, ≥0.09 m$^2$/g or ≥0.1 m$^2$/g.

The powder form (aggregate or agglomerate), the low nanohardness, the high BET surface area and the porosity all have an advantageous effect, individually or particularly advantageously in combination, on the spray behaviour. It is to be assumed that the low nanohardness advantageously influences the flowability of the individual powder particles. The mechanism of action of the porosity, of the powder form and of the BET surface area on the spray behaviour are not yet understood in detail. It is wholly possible that this is an interplay of a plurality of effects, namely:

- reduction of the flow stress
- facilitation of microplastic flow processes
- lower solidification by cold deformation (fewer dislocation paths to the nearest surface, also pore surface)
- higher particle spread on impact
- better mechanical interlocking and thus greater adhesion.

How a coating material having the features described above can be produced in a more reliable manner will be described in detail below.

It is further advantageous if the Cr-containing particles have a particle size $d_{50}$ of >5 μm and <150 μm. The $d_{50}$ value is measured by means of laser diffractometry using standard (ISO 13320-2009). Further advantageous ranges are: 10 μm<$d_{50}$<120 μm or 15 μm<$d_{50}$<100 μm. Values in the lower size range can be achieved without an additional granulating step. If the production takes place without granulation, the product that is produced is referred to as a powder. Values in the upper $d_{50}$ range can be achieved if, for example, the starting product (for example Cr oxide or Cr hydroxide), an intermediate (for example Cr metal powder) is granulated by conventional processes. A product produced in that manner is referred to as powder granules.

In the case of very brittle materials such as, for example, Cr, the particle size of the coating material has hitherto been kept very fine, because only the small particles achieve the velocity necessary for adhesion. However, very fine powders do not flow well and can lead to clogging of the powder feed systems. In addition, the use of fine powder leads to an impairment of the coating quality, because the particle binding upon impact on the substrate is poorer in the case of powder having a very small particle size than in the case of coarser powder. These size effects are based on dynamic effects, such as the very rapid equalization of the heat formed locally at the boundary surfaces on impact, and on a higher dynamic strength of the material as a result of strain-rate solidification. Both are more pronounced in the case of the impact of smaller particles. With the coating material according to the invention, it is now possible to achieve a high coating quality even with lower impact velocities. Coarser powders can thus also be used.

Advantageously, the Cr content in the coating material is >20% by mass, preferably >50% by mass, >60% by mass, >70% by mass or >80% by mass, particularly preferably >90% by mass, 95% by mass or >99% by mass.

The coating material according to the invention also yields advantageous results when one or more further coating materials are added. In the case of cold gas spraying in particular, it has been possible to achieve excellent results when there is applied to the surface of the Cr-containing particles, at least in regions, a material that has a lower yield strength and/or hardness than Cr. The preferred content is from 0.01 to 50% by mass, particularly preferably from 0.1 to 30% by mass or from 3 to 25% by mass. Face-centred metals such as, for example, Ni or Cu have been found to be particularly suitable.

The coating hardness can advantageously be increased by adding a hard material. There can be used as the hard material all conventional hard materials, such as, for example, carbides, borides or nitrides. Advantageous carbides are, for example, chromium or tungsten carbides. Chromium carbides can be produced in situ during the production, which leads to a particularly homogeneous and fine distribution of the carbides. Surprisingly, powder mixtures having a proportion of hard material of up to 80% by mass, remainder Cr, can still be sprayed by cold gas spraying. The preferred proportion of hard material in the coating material is from 0.1% by mass to 80% by mass, particularly preferably from 1% by mass to 50% by mass.

Advantageous properties can, however, also be achieved when a solid lubricant, such as, for example, graphite, a sulfide (advantageously molybdenum disulfide), boron nitride or an oxide (advantageously vanadium oxide), is added to the coating material. The maximum content of lubricant is determined by the achievable coating quality. Preferably, the content of lubricant is from 0.1% by mass to 30% by mass, particularly preferably from 1% by mass to 25% by mass.

It has even been shown that the coating composition according to the invention also yields an improvement in the coating properties when it is used only to produce a coating that is based on a different material. For example, a layer of an MCrAlY alloy can be produced in very high quality by means of cold gas spraying. MCrAlY is understood as meaning an Ni- or Fe-based alloy which comprises Cr, Al and a rare earth metal (for example Y).

The coating material advantageously comprises from 0.005 to 5% by mass of one or more rare earth metals (including yttrium). The rare earth metals can preferably also be present in oxidized form. Rare earth metals or rare earth metal oxides have a particularly advantageous effect on the corrosion properties.

Preferred further compositions (preferred Cr content >50% by mass) are:
- Cr comprising at least one metal from the group Fe, Co, Mn, Al, Nb, Ta and V; preferred content from 0.01 to 50% by mass; particularly preferred content from 0.1 to 30% by mass or from 3 to 25% by mass;
- Cr comprising at least one metal from the group Ti, Zr, Hf, Mo, W and Re; preferred content from 0.01 to 20% by mass;
- Cr comprising Si and/or B, preferably from 0.005 to 20% by mass, particularly preferably up to 10% by mass, 5% by mass or 2% by mass.

All the alloying components mentioned in the description also yield advantageous properties in combination.

The object according to the invention is also achieved by a process for the production of a coating using the coating material according to the invention. Advantageously, a thermal spraying process is used.

A particularly suitable process is cold gas spraying. Advantageously, the process comprises at least the following steps:
- providing a process gas having a pressure of from 10 to 100 bar, advantageously from 20 to 60 bar, particularly advantageously from 30 to 50 bar, and a temperature between room temperature and 1400° C., advantageously from 300 to 1200° C., particularly advantageously from 600 to 1000° C.;
- accelerating the process gas in a convergent-divergent nozzle, preferably to ultrasonic velocity;
- injecting the coating material according to the invention into the process gas upstream, in or downstream of the convergent-divergent nozzle; and
- forming an adherent layer upon impact of the coating material on a substrate.

The upper ranges of the advantageous pressures and temperatures are given by the installations that are currently available. In principle, a higher process gas temperature and a higher pressure increase the impact velocity of the particles on the substrate surface and therefore have an advantageous effect on the coating properties. A higher process gas temperature also brings about a higher temperature of the particles upon impact on the substrate surface, which likewise has an advantageous effect on the coating properties. Therefore, should installations which permit higher pressures and/or temperatures be available in the future, the advantageous ranges can shift towards higher values.

It is known that the impact velocity of the particles must exceed a critical limit in order to achieve adhesion of the particles to the substrate. This critical velocity depends mainly on the coating material used, the particle size and the temperature of the particles and the substrate. With the coating material according to the invention it is possible significantly to lower the critical impact velocity. Accordingly, it also possible to use nitrogen or a nitrogen-rich (>50% by volume nitrogen) gas as the process gas. Accordingly, process gases such as helium or helium-containing gas mixtures, which lead to higher gas velocities but with significantly higher process costs, are not required. Advantageously, therefore, nitrogen or a nitrogen-containing gas is used as the process gas.

However, it has also been shown that the coating material according to the invention is also advantageously usable with process techniques in which the particle velocity is lower compared with cold gas spraying and the particle temperature is higher. It has thus been possible to achieve very good coating results with high-velocity flame spraying processes.

The object according to the invention is also achieved by a coating having a Cr content >50% by mass, a mean thickness >20 μm and a microstructure which contains at least partially deformed Cr-containing grains. Preferably, the mean thickness is >30, >40 or >50 μm. Preferably, the Cr content is >70% by mass, particularly preferably >90% by mass, >95% by mass or >99% by mass. The deformed Cr-containing grains of the coating preferably have a mean nanohardness $HIT_{0.005/5/1/5}$ of >4 G pa. The mean nanohardness $HIT_{0.005/5/1/5}$ is preferably >4.3 GPa, >4.6 GPa, >4.9 GPa, >5.2 GPa, >5.5 GPa or >6 GPa. The determination of the layer thickness is carried out by conventional metallographic methods. Measurement of the nanohardness is carried out on a cross-section in a manner analogous to that explained in the description for determining the powder hardness.

The coating is preferably produced by cold gas spraying. The cold gas spraying advantageously comprises at least the steps of providing a process gas having a pressure of from 10 to 100 bar and a temperature between room temperature and 1400° C.; accelerating the process gas in a convergent-divergent nozzle; injecting the coating material into the process gas upstream, in or downstream of the convergent-divergent nozzle; and forming an adherent layer on impact of the coating material on a substrate. Advantageously, nitrogen or a nitrogen-rich gas is used as the process gas. As already mentioned at the beginning, it has not hitherto been possible to produce coatings from a Cr-based material (Cr content >50% by mass) by cold gas spraying. Cold gas spraying implies a deformation of the grains at a temperature<melting point of the sprayed particles. The grains are preferably cold-deformed. Cold deformation is to be understood as meaning the metallurgical definition, namely that the particles, upon impact on the substrate, are deformed at a temperature which is below the recrystallization temperature of the material in question. Because the time of action of the temperature is very short, the temperature required for recrystallization according to the Arrhenius equation is very high. The deformation of the particles upon impact has the effect that at least some of the grains of the coating that are formed from the particles are stretched preferably in the lateral direction (parallel to the layer surface), the mean (mean of at least 10 stretched grains) aspect ratio being >1.3. Particularly preferably, the mean aspect ratio is >2, >3, >4 or >5. The aspect ratio is determined metallographically, for example by image analysis.

Preferred compositions (also in a combination of the listed components) of the coating are:
- Cr content >60% by mass, >70% by mass, >80% by mass or >90% by mass; particularly preferably Cr of purity >95% by mass or >99% by mass;
- Cr (Cr content >50% by mass) comprising a solid lubricant, such as, for example, graphite, a sulfide (advantageously molybdenum disulfide), boron nitride or an oxide (advantageously vanadium oxide), preferred content of lubricant from 0.1 to 30% by mass, particularly preferably from 1% by mass to 25% by mass;
- Cr (Cr content >50% by mass) comprising at least one hard material; in particular one or more carbides (for example chromium and tungsten carbides), borides and/or nitrides; preferred proportion of hard material >0.1% by mass, particularly preferably >1% by mass; preferred range for proportion of hard material from 0.1 to 50% by mass;

Cr (Cr content >50% by mass) comprising at least one further metal;
  Preferably at least one metal having a lower yield strength and/or hardness than Cr; preferred content from 0.01 to 50% by mass;
  Preferably at least one metal from the group Ni, Cu, Fe, Co, Mn, Al, Nb, Ta and V; preferred content from 0.01 to 50% by mass; particularly preferred content from 0.1 to 30% by mass or from 3 to 25% by mass;
  Preferably at least one metal from the group Ti, Zr, Hf, Mo, W and Re; preferred content from 0.01 to 20% by mass;
  Preferably at least one rare earth metal (including yttrium); preferred content from 0.005 to 5% by mass; preferably also present in oxidized form;
Cr (Cr content >50% by mass) comprising Si and/or B, preferably from 0.005 to 20% by mass, particularly preferably 10% by mass, 5% by mass or 2% by mass.

The coating according to the invention preferably has a density (measured by the buoyancy method) of >85%, in particular of >93%, 95% or 98%. The O content (oxygen content) of the coating is preferably <0.3% by mass, <0.2% by mass or <0.1% by mass. The C content (carbon content) of the coating is preferably <0.05% by mass, <0.035% by mass or <0.02% by mass. Furthermore, the coating is preferably free of particles which have not undergone a change of shape as a result of the spraying operation.

A process is described in the following with which the coating material according to the invention can be produced inexpensively in a simple and reliable manner.

This process comprises reducing at least one compound from the group consisting of Cr oxide and Cr hydroxide, optionally with an added solid carbon source, under the at least temporary action of hydrogen and hydrocarbon. There are suitable as the chromium oxide or chromium hydroxide preferably Cr(III) compounds in powder form, for example $Cr_2O_3$, CrOOH, $Cr(OH)_3$ or mixtures of chromium oxides and chromium hydroxides. The preferred chromium source is $Cr_2O_3$. For a high degree of purity in the end product, it is preferably provided that the $Cr_2O_3$ used is at least of pigment grade.

Preferably, the compound from the group consisting of Cr oxide and Cr hydroxide, optionally with an added solid carbon source, is heated to a temperature $T_R$ with 1100° C.≤$T_R$≤1550° C. and optionally held at that temperature. Temperatures <1100° C. or >1550° C. lead to impaired powder properties, or to a less economical process. For industrial purposes, the reaction proceeds particularly well when temperatures $T_R$ of approximately from 1200° C. to 1450° C. are chosen.

While very long holding times at $T_R$ are necessary in the lower temperature range according to the invention in order to establish an advantageous degree of reduction of 90%, the holding time can be chosen to be very short in the upper temperature range according to the invention or can be omitted altogether. The degree of reduction R is defined as the ratio of the amount of oxygen decomposed at time t relative to the total amount of oxygen present in the chromium oxide or chromium hydroxide.

On the basis of the examples, the person skilled in the art can easily determine the optimum combination of temperature and time for his furnace (continuous furnace, batch furnace, maximum achievable furnace temperature, . . . ). The reaction is preferably kept substantially constant (isothermal) at $T_R$ for at least 30%, particularly preferably at least 50%, of the reaction time.

The presence of hydrocarbon ensures that powder having the properties according to the invention is formed by a chemical transport process. The total pressure of the reaction is advantageously from 0.95 to 2 bar. The hydrocarbon is advantageously present in the form of $CH_4$. Preferably, at least during the heating operation, the hydrocarbon partial pressure is from 5 to 500 mbar at least temporarily. The residual gas atmosphere is preferably hydrogen. The action of hydrogen and hydrocarbon preferably takes place at least in the temperature range from 800° C. to 1050° C. In this temperature range, the hydrocarbon partial pressure is preferably from 5 to 500 mbar. The reaction mixture that forms from the starting materials is in that temperature range for preferably at least 45 minutes, particularly preferably at least 60 minutes. This time includes both the heating operation and any isothermal holding phases in that temperature range. With the process conditions according to the invention, it is ensured that, at temperatures preferably <$T_R$, at least one compound selected from the group consisting of Cr oxide and Cr hydroxide is converted at least partially into chromium carbide under the action of hydrogen and hydrocarbon. Preferred chromium carbides are $Cr_3C_2$, $Cr_7C_3$ or $Cr_{23}C_6$. The partial formation of chromium carbide which is established via the hydrocarbon partial pressure in turn has an advantageous effect on the powder properties. With the process conditions according to the invention, it is further ensured that the chromium carbide reacts with the Cr oxide/Cr hydroxide present in and/or added to the reaction mixture to form Cr, this process being dominant at $T_R$.

The hydrocarbon can be added to the reaction in gaseous form. Preferably, the at least one compound from the group consisting of Cr oxide and Cr hydroxide is reduced under the at least temporary action of an $H_2$—$CH_4$ gas mixture. Advantageously, an $H_2$/$CH_4$ volume ratio in the range of from 1 to 200, particularly advantageously from 1.5 to 20, is chosen. The action of the $H_2$—$CH_4$ gas mixture preferably takes place at least temporarily during the heating phase to $T_R$, the influence on the formation of the powder form being very advantageous in particular in the temperature range from 850 to 1000° C. If a temperature of approximately 1200° C. is reached, the atmosphere is preferably changed to a pure hydrogen atmosphere, preferably with a dewpoint of <−40° C. (measured in the region of the gas supply). If $T_R$ is below 1200° C., the changeover to the pure hydrogen atmosphere preferably takes place when $T_R$ is reached. The isothermal phase at $T_R$ and cooling to room temperature advantageously take place in a hydrogen atmosphere. In particular during cooling, it is advantageous to use hydrogen with a dewpoint <−40° C. in order to avoid reoxidation.

It is also possible to add a solid carbon source to the Cr oxide and/or Cr hydroxide. Preferably, between 0.75 and 1.25 mol, more preferably between 0.90 and 1.05 mol, of carbon are used per mol of oxygen in the chromium compound. The amount of carbon available for the reaction with the chromium compound is thereby meant. In a particularly preferred variant embodiment, the ratio O to C, at approximately 0.98, is slightly sub-stoichiometric. It is preferably provided that the solid carbon source is selected from the group carbon black, active carbon, graphite, carbon-releasing compounds or mixtures thereof. An example of a carbon-releasing compound which may be mentioned is chromium carbides, such as, for example, $Cr_3C_2$, $Cr_7C_3$ and $Cr_{23}C_6$. The powder mixture is heated to $T_R$ in an $H_2$-containing atmosphere. The $H_2$ pressure is preferably so adjusted that a $CH_4$ partial pressure of from 5 to 500 mbar is obtained at least in the temperature range from 800° to 1050° C. The isothermal phase at $T_R$ and cooling to room temperature are again advantageously carried out in a hydrogen atmosphere. The presence of hydrocarbon is not necessary during these phases of the process. Hydrogen prevents reoxidation processes in this phase of the process and during the cooling phase. During the cooling phase, a hydrogen atmosphere with a dewpoint <−40° C. is preferably used.

Before the reduction, the Cr oxide or Cr hydroxide powder can be granulated. As already mentioned, granulation denotes the conversion of small particles into granules, which are an accumulation of the small particles. Suitable granulating processes are, for example, spray granulation or layering granulation processes in an intensive mixer with the addition of a surface-active additive, for example polyvinylpyrrolidone. Granulation before the reduction is also advantageous because it improves the penetration of the gaseous starting materials (for example hydrogen) and the gaseous products (for example CO), since regions exist between the granule particles where the gases can flow without friction losses.

One or more alloying elements in oxidized form can advantageously be added to the Cr oxide or Cr hydroxide before the reduction, and particularly advantageously before any granulation operation. Preferably, the oxides of the alloying elements cannot be reduced or can be reduced only slightly under the conditions of the reduction of the chromium oxide, so that it is ensured that solid solution strengthening of the chromium by the diffusion of the alloying element in the elemental state is avoided.

BRIEF DESCRIPTION OF THE SEVERAL VIEWS OF THE DRAWING

The invention is explained in greater detail in the following by means of examples.

DESCRIPTION OF THE INVENTION

EXAMPLE 1

Figure 1:
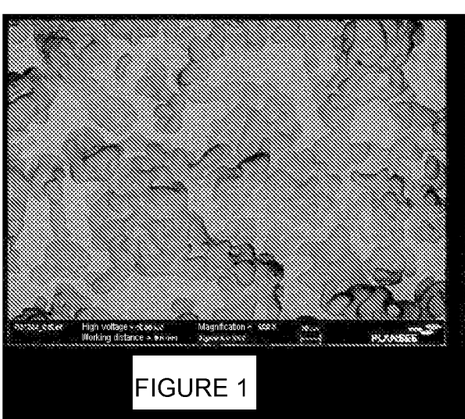
FIG. 1 shows a scanning electron microscope image of the coating material according to the invention with a sieve fraction <45 μm according to Example 1.
Figure 2:
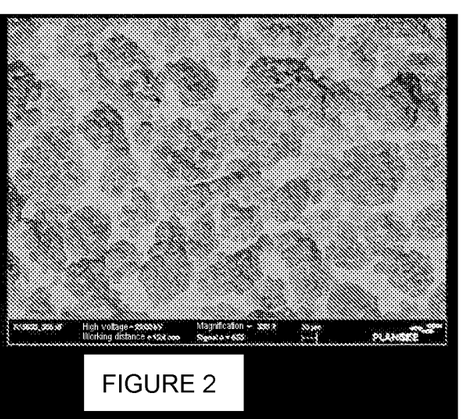
FIG. 2 shows a scanning electron microscope image of the coating material according to the invention with a sieve fraction 45-100 μm according to Example 1.
Figure 3:
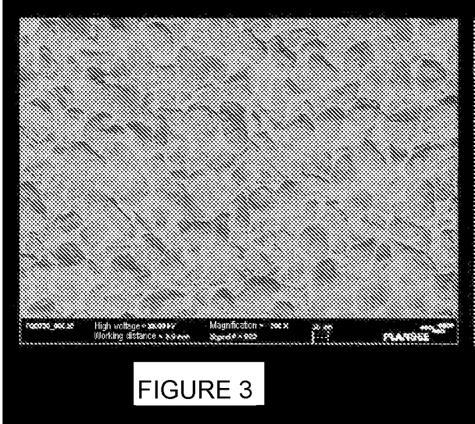
FIG. 3 shows an electrolytically reduced Cr powder with a sieve fraction <45 μm according to the prior art.

A mixture of $Cr_2O_3$ having a mean particle size $d_{50}$, measured by means of laser diffraction, of 0.9 μm and amorphous carbon black (carbon content 0.99 mol/mol O in $Cr_2O_3$) was heated to 1050° C. under the action of $H_2$. The heating rate was so adjusted that the $CH_4$ partial pressure, measured by mass spectrometry, in the temperature range from 800° C. to 1050° C. was >15 mbar. The reaction mixture was then heated to 1450° C. The holding time at 1450° C. was 5 hours. Heating from 1050° C. to 1450° C. and holding at 1250° C. were carried out with the supply of dry hydrogen with a dewpoint <−40° C., the pressure being approximately 1 bar. Furnace cooling was likewise carried out under $H_2$ with a dewpoint <−40° C. The Cr powder so produced was sieved at 45 μm (sieve fraction <45 μm) and the remainder at 100 μm (sieve fraction 45-100 μm). The sieve fraction <45 μm is shown in FIG. 1 and the sieve fraction 45-100 μm in FIG. 2. An electrolytically reduced Cr powder (see FIG. 3) according to the prior art was likewise sieved at 45 μm. This was used for comparison purposes. FIG. 1 and FIG. 2 clearly show that the particles have pores. FIG. 1 and FIG. 2 also show that the particles have the typical appearance of aggregates or agglomerates. An attempt was made to deagglomerate the powder by the action of ultrasound (20 Hz, 600 W). However, because this was not possible, the powder is present in the form of an aggregate according to the definition given in the description. The prior art powder shown in FIG. 3 does not have pores, nor is it present in the form of an agglomerate or aggregate.

The determination of the porosity was carried out as described in detail in the description by quantitative image analysis. The porosity of 10 particles was thereby determined, the porosity values for the sieve fraction 45-100 μm being between 65% by volume and 74% by volume. The mean porosity was 69% by volume. For the sieve fraction <45 μm, the porosity was between 25% by volume and 73% by volume. The mean porosity was 37% by volume. The BET surface area was determined in accordance with ISO 9277:1995 (instrument: Gemini 2317/type 2, degassing at 130° C./2 h in vacuo, adsorptive: nitrogen, volumetric evaluation by five-point determination) and was 0.09 m²/g for the sieve fraction 45-100 μm and 0.10 m²/g for the sieve fraction <45 μm. The particle sizes were determined by laser diffractometry (in accordance with ISO13320 (2009)). The $d_{50}$ values are given in Table 1.

Thereafter, a powder section was prepared and the mean (mean of 10 measurements) nanohardness $_{HIT\ 0.005/5/1/5}$ (measured in accordance with EN ISO 14577-1, 2002 edition, Berkovich indenter and evaluation method according to Oliver and Pharr) was determined in the cross-section on Cr-rich regions. The mean nanohardnesses are likewise summarized in Table 1.

X-ray diffraction analysis yielded only peaks for cubic space-centred (bcc) chromium metal for all the powders. The chemical analysis values for C and O are likewise to be found in Table 1.

TABLE 1

|  | Cr powder according to the invention Sieve fraction <45 μm | Cr powder according to the invention Sieve fraction 45-100 μm | Cr powder prior art Sieve fraction <45 μm |
|---|---|---|---|
| $d_{50}$ particle size (μm) | 26.9 | 74.5 | 35.4 |
| Nano-hardness$_{HIT\ 0.005/5/1/5}$ (GPa) | 2.924 +/− 0.105 | 2.758 +/− 0.074 | 5.321 +/− 0.328 |
| C content [μg/g] | 114 | 123 | 87 |
| O content [μg/g] | 1064 | 971 | 736 |

EXAMPLE 2

Cr powder with the particle size fraction <45 μm according to Example 1 was sprayed by cold gas spraying (CGS). The substrates consisted of ground pipes of the materials 1.4521 (×2 CrMoTi 18-2) and AlMg3, the diameter being 30 mm and the length 165 mm. Before being coated, the pipes were cleaned with alcohol, clamped at one end in a rotatable receiver and coated at the free end. A peripheral layer with the substrate rotating as well as lines in the axial direction without rotation of the substrate were produced. The cold gas spraying process was carried out with nitrogen (75.5 m$^3$/h). The process gas pressure was 34 bar and the process gas temperature was 800° C. The process gas was preheated to 500° C. with a heater and brought to the process gas temperature in a preheating chamber in the spray gun, in which the supply of the powder also took place.

The process gas/powder mixture was passed through a Laval nozzle (form of a convergent-divergent nozzle) and sprayed perpendicularly to the substrate surface at a spray distance of 30 mm. The axial feed of the spray gun was 5 mm/s and the speed of rotation was 560 rpm. Feeding of the powder was carried out by a perforated disc from a powder container which was under a pressure of 35 bar. The powder feed amount was approximately 100 g/minute.

Figure 4A:
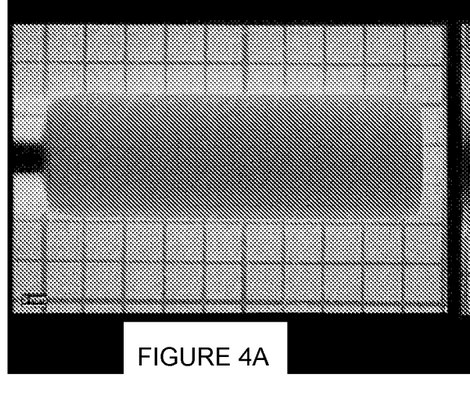
FIG. 4 shows a CGS Cr coating according to the invention, deposited on a steel pipe using the coating material according to the invention according to Example 2.
Figure 4B:
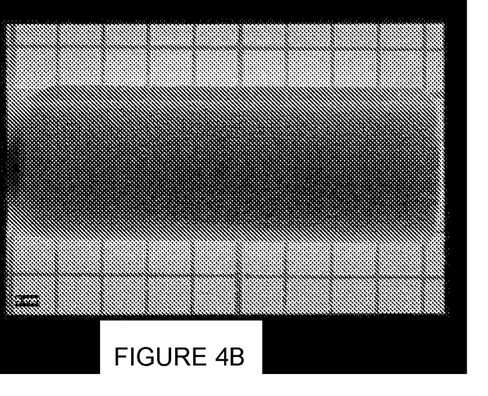
Figure 5:
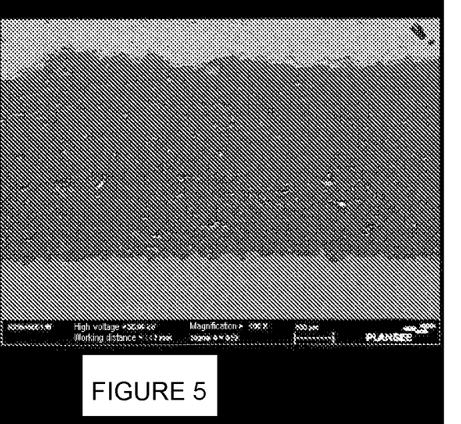
FIG. 5 shows a scanning electron microscope image of a CGS Cr coating according to the invention deposited on an AlMg3 pipe using the coating material according to the invention according to Example 2.

It was possible to produce Cr coatings with the typical appearance (see FIG. 4) of CGS layers. With a rotating substrate, a coating thickness of 50 μm per pass could be achieved. Good bonding of the coating to the substrate materials is shown. The coating density (relative specific density) was determined optically by image analysis and also by the buoyancy method. By means of image analysis, a mean density of 91% was determined in the case of the AlMg3 substrate; the mean density determined by the buoyancy method was 93.5%. The cross-section of this coating is shown in FIG. 5. The dark regions are breakouts caused by the preparation. In the line, a mean density of 97.2% (buoyancy method) was determined. The mean nanohardness $_{HIT\ 0.005/5/1/5}$ was 6 GPa (mean of 10 individual measurements). The grains were cold deformed (demonstrated by TEM analysis) and at least some had an aspect ratio (determined in the cross-section, determination of the aspect ratio (grain length/grain width) by quantitative image analysis) of up to 5.

EXAMPLE 3

Under the conditions of Example 2 (deposition in lines in the axial direction without substrate rotation), the process gas temperature was varied. The following process gas temperatures were used: 800° C., 700° C., 600° C., 500° C. and 400° C. Strongly adherent layers could be deposited at all temperatures. The layer porosity is very low at process gas temperatures from 800° C. to 600° C. At process gas temperatures of 400° C. and 500° C., lined patterns are observed, which indicate slightly weaker bonding between the individual coating layers. In the line, a mean density of 98.7% (buoyancy method) was determined for the process gas temperature 800° C. The mean nanohardness $_{HIT\ 0.005/5/1/5}$ was 6.3 GPa (mean of 10 individual measurements) for the process gas temperature 800° C. The grains were cold deformed and at least some had an aspect ratio of up to 6 (determined by way of example for process gas temperature 800° C.).

EXAMPLE 4

Cr powder according to the invention according to Example 1 with the particle size fraction <45 μm was sprayed onto a ground AlMg3 pipe, cleaned with alcohol, having a diameter of 45 mm and a length of 165 mm. The cold gas spraying process was carried out with nitrogen at a process gas pressure of 34 bar and a process gas temperature of 800° C. (type A installation) and with nitrogen at a process gas pressure of 41.6 bar and a process gas temperature of 950° C. (type B installation). In the case of type A, the process gas was preheated to 500° C. with a heater and brought to the process gas temperature in a preheating chamber in the spray gun. In the case of type B, heating was carried out entirely in the heater of the spray gun, in which the feeding of the powder into a nitrogen stream also took place. The process gas/powder mixture was passed through a Laval nozzle and sprayed perpendicularly to the substrate surface at a spray distance of 30 mm. The axial feed of the spray gun was 5 mm/second, the speed of rotation was 560 rpm. Powder feeding was carried out according to Example 2.

Figure 6:
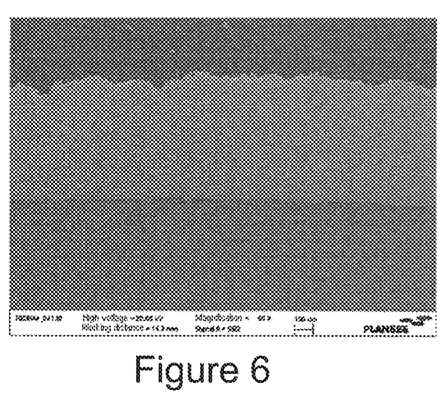
FIG. 6 shows a scanning electron microscope image of a CGS Cr coating according to the invention using the coating material according to the invention (sprayed with type B installation) according to Example 4.

With the process parameters of the type A installation, a coating of 330 μm could be produced with 10 passes. With the process parameters of the type B installation, a coating of 740 μm (see FIG. 6) could likewise be produced with 10 passes. The bonding of both coatings to the substrate material is very good.

The coating (sprayed with installation B) had a mean density of 99.2% (buoyancy method). The grains were cold deformed and at least some had an aspect ratio of up to 5.5 (measured by way of example for installation B).

EXAMPLE 5

A powder according to the invention according to Example 1 with the particle size fraction 45-100 μm was sprayed according to Example 2 (deposition in lines in the axial direction without substrate rotation). The process gas temperatures were 800° C., 700° C., 600° C., 500° C. and 400° C. Strongly adherent coatings could be produced at all temperatures. At process gas temperatures of 800° C., 700°

C. and 600° C., dense and defect-free coatings could be produced. At 500° C. and 400° C., a lined structure is found, which indicates somewhat poor bonding between the individual coating layers. In the line, a mean density of 98.5% was determined for the process gas temperature 800° C. and a mean density of 97.5% was determined for the process gas temperature 600° C. (in each case measured by the buoyancy method). The grains were cold deformed and at least some had an aspect ratio of up to 5.5 (process gas temperature 600° C.) or up to 6 (process gas temperature 800° C.). The mean nanohardness $_{HIT\ 0.005/5/1/5}$ was 6.7 GPa (mean of 10 individual measurements) for the process gas temperature 600° C.

EXAMPLE 6

Figure 7:
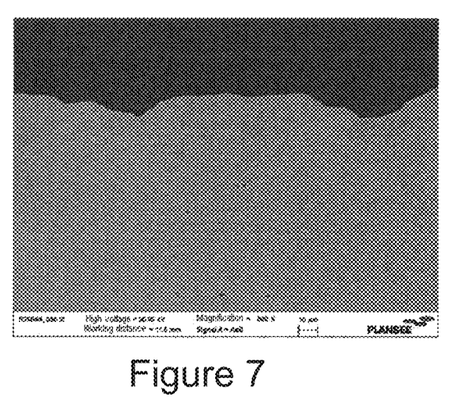
FIG. 7 shows a scanning electron microscope image of a steel substrate on which it has been attempted, according to Example 6, to deposit a CGS Cr coating with prior art powder.
Figure 8:
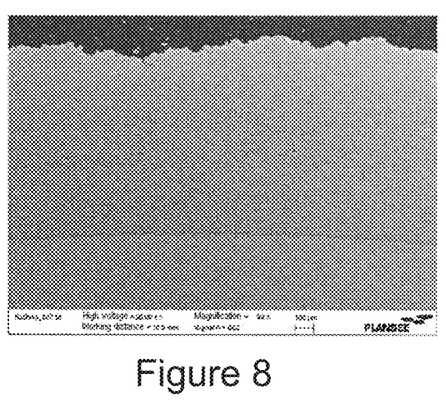
FIG. 8 shows a scanning electron microscope image of a CGS Cr coating according to the invention, deposited on a steel substrate using the coating material according to the invention according to Example 6.

Powder according to the invention according to Example 1 and a powder according to the prior art (electrolytically reduced, see FIG. 3) each with a particle size fraction <45 µm were sprayed using a cold gas spraying installation of type B (see Example 4) onto a ground steel pipe, cleaned with alcohol, having a diameter of 60 mm and a length of 165 mm. The cold gas spraying process was carried out at a process gas pressure of 41.6 bar and a process gas temperature of 950° C. The process gas/powder mixture was passed through a Laval nozzle and sprayed perpendicularly to the substrate surface at a spray distance of 30 mm. The axial feed of the spray gun was 5 mm/second, the speed of rotation was 560 rpm. Feeding of the powder was carried out according to Example 2. While it was not possible to produce a coating (only fragmented Cr regions, see FIG. 7) with the prior art powder, a coating thickness of 1190 µm (see FIG. 8) was achieved with the powder according to the invention.

EXAMPLE 7

Figure 9:
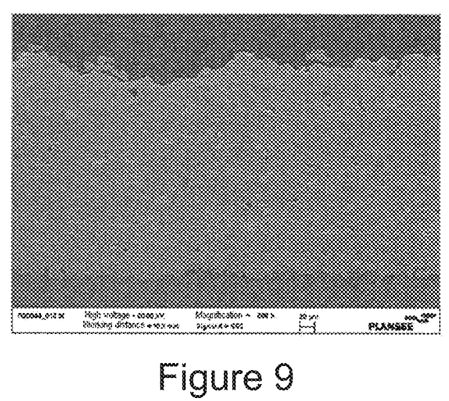
FIG. 9 shows a scanning electron microscope image of a CGS Cr-10% by mass $Cr_{23}C_6$ coating according to the invention, produced using the coating material according to the invention, deposited on an AlMg3 substrate according to Example 7.
Figure 10:
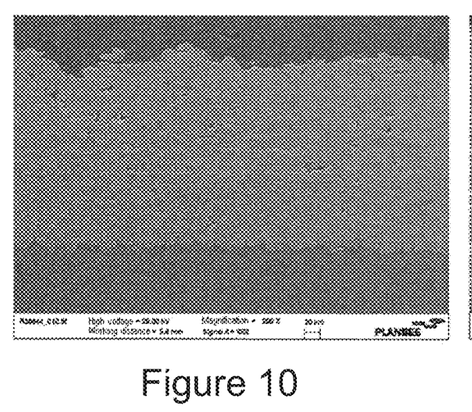
FIG. 10 shows a scanning electron microscope image of a CGS Cr-50% by mass $Cr_{23}C_6$ coating according to the invention, produced using the coating material according to the invention, deposited on an AlMg3 substrate according to Example 7.

1617 g of $Cr_2O_3$ (pigment grade Lanxess Bayoxide CGN-R) were mixed with 382.8 g of carbon black in a diffusion mixer. The mixture so prepared was heated to 800° C. at a heating rate of 10 K/minute and then to 1050° C. at a heating rate of 2 K/minute. Heating took place under the action of $H_2$, the $H_2$ pressure being so adjusted that the $CH_4$ partial pressure, measured by mass spectrometry, in the temperature range 800° C. to 1050° C. was >15 mbar. The total pressure was approximately 1 bar. The reaction mixture was then heated to 1450° C. at a heating rate of 10 K/minute. The holding time at 1450° C. was 7 hours. Heating from 1050° C. to 1450° C. and holding at 1450° C. took place with the supply of dry hydrogen with a dewpoint <−40° C., the pressure being approximately 1 bar. Furnace cooling likewise took place under $H_2$ with a dewpoint <−40° C. A proportion of approximately >50% by mass of the Cr-containing particles of the powder so obtained were in the form of an aggregate, and approximately 10% by mass were in the form of an agglomerate. The remaining portion exhibited an irregular form according to the ASM classification. In addition, at least some of the Cr-containing particles had pores. A chemical analysis of the powder gave a C content of 5720 µg/g and an O content of 420 µg/g. An XRD analysis of the powder gave only peaks for the phases Cr (bcc) and $Cr_{23}C_6$. On the basis of the C content, this gives a composition of 90% by mass Cr and 10% by mass $Cr_{23}C_6$. The BET surface area of the powder was 0.09 m²/g and the particle size $d_{50}$, determined by means of laser diffractometry, was 32.2 µm. This powder was sprayed under the conditions of Example 2. A dense, strongly adherent coating having a layer thickness of 250 µm could be deposited. In an analogous manner, a coating having the composition 50% by mass Cr and 50% by mass $Cr_{23}C_6$ was also produced. These coatings are shown by way of example in FIG. 9 and FIG. 10 (substrate AlMg3 pipe in each case).

For 90% by mass Cr-10% by mass $Cr_{23}C_6$, a mean density of 99.0% was determined, and for 50% by mass Cr-50% by mass $Cr_{23}C_6$, a mean density of 98.2% was determined (in each case measured by the buoyancy method). The Cr-containing grains were cold deformed and at least some had an aspect ratio of up to 5 (90% by mass Cr-10% by mass $Cr_{23}C_6$) or of up to 7 (50% by mass Cr-50% by mass $Cr_{23}C_6$). The mean nanohardness $_{HIT\ 0.005/5/1/5}$ of the Cr-containing grains was 7.2 GPa (mean of 10 individual measurements) for 50% by mass Cr-50% by mass $Cr_{23}C_6$.

EXAMPLE 8

Figure 11:
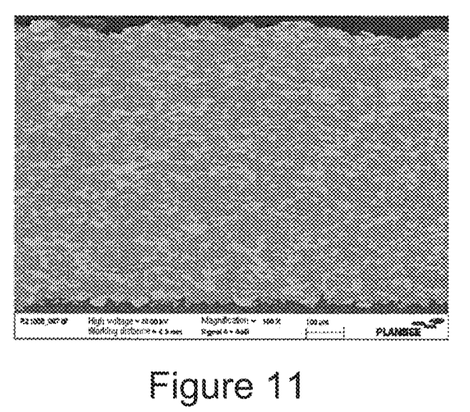
FIG. 11 shows a scanning electron microscope image of a CGS Cr-30% by mass Cu coating according to the invention, produced using the coating material according to the invention, deposited on an AlMg3 substrate according to Example 8.

Powder according to the invention according to Example 1 with a particle size fraction <45 µm was mixed with 1% by mass, 5% by mass, 10% by mass, 20% by mass and 30% by mass atomized Cu powder having a particle size $d_{50}$, measured by laser optical measurement, of 26 µm and sprayed using two powder feed units. The substrate materials and arrangement corresponded to Example 2. The cold gas spraying process was carried out with nitrogen (75.5 m³/h) at 41.6 bar and 950° C. (type B installation) and 34 bar and 800° C. (type A installation). Defect-free and strongly adherent coatings having a thickness of approximately from 400 to 800 µm could be produced with all powder mixtures/installations. The coating structure for the composition Cr-30% by mass Cu/type B installation is shown by way of example in FIG. 11.

For 30% by mass Cu, a mean density of 99.6% (buoyancy method) was determined. The Cr-containing grains were cold deformed and at least some had an aspect ratio of up to 10 (30% by mass Cu). The mean nanohardness $_{HIT\ 0.005/5/1/5}$ of the Cr-containing grains was 5.2 GPa (mean value of 10 individual measurements) for 30% by mass Cu.

EXAMPLE 9

Figure 12:
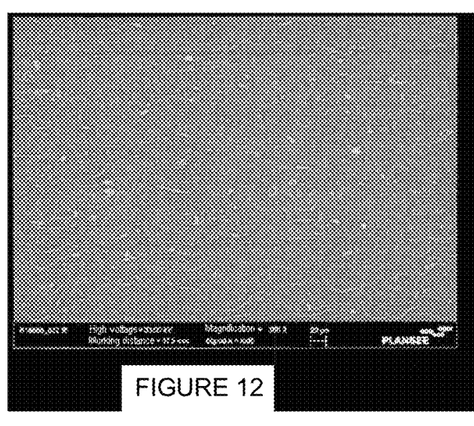
FIG. 12 shows a scanning electron microscope image of an APS Cr spray coating, produced using the coating substance according to the invention according to Example 9.

Cr powder according to the invention according to Example 1 with a particle size fraction of 45-100 µm was sprayed by means of HVOF and APS under conventional conditions. Dense, strongly adherent coatings could be produced. An APS layer is shown by way of example in FIG. 12.

EXAMPLE 10

Cr powder according to the invention according to Example 1 with a particle size fraction of 45-100 µm was electro nickel plated in a Watts bath stirred by means of a rotating electrode. The thickness of the nickel layer was 4 µm. The powder was sprayed under the conditions according to Example 2 onto a ground, cleaned × 2 CrMoTi 18-2 pipe having a diameter of 30 mm. Strongly adherent Cr—Ni coatings having a thickness of 250 µm could be produced. A mean density of 98% was determined by the buoyancy method.

EXAMPLE 11

An MCrAlY powder having the composition 25% by mass Cr, 10% by mass Al, 0.5% by mass Y, remainder Ni was prepared. To that end, Cr powder according to Example 1 with a particle size fraction of 45-100 µm was mixed with Ni powder of grain fraction 20-45 µm, $Y_2O_3$ powder ($d_{50}$=0.6 µm) and with Al powder ($d_{50}$=10.6 µm). The powder was sprayed under the conditions according to Example 2 onto a ground, cleaned × 2 CrMoTi 18-2 pipe having a diameter of 30 mm. A strongly adherent coating could again be produced. A mean density of 98.5% was determined by the buoyancy method.

EXAMPLE 12

Powder according to the invention according to Example 1 with a particle size fraction <45 µm was mixed with 1% by mass, 3% by mass and 5% by mass $MoS_2$ powder having a particle size according to Fischer of approximately 1 µm and sprayed. The substrate materials and arrangement correspond to Example 2.

The cold gas spraying process was carried out with nitrogen (75.5 m³/h) at 41.6 bar and 950° C. (type B installation). Defect-free and strongly adherent coatings having a thickness of approximately 300 µm could be produced with all the powder mixtures.

EXAMPLE 13

Powder according to the invention according to Example 1 with a particle size fraction <45 µm was mixed with 3% by mass of graphite powder having a particle size according to Fischer of approximately 0.5 µm. The graphite powder was thereby spread into the pores of the chromium powder, as a result of which the pores were partially filled. The powder was sprayed according to Example 2. Defect-free and strongly adherent coatings having a thickness of approximately 500 µm could again be produced.

EXAMPLE 14

1627.2 g of $Cr_2O_3$ powder (pigment grade Lanxess Bayoxide CGN-R), 372.8 g of carbon black (Thermax Ultra Pure N 908 from Cancarb), 1.2 g of $Y_2O_3$ having a particle size $d_{50}$, measured by means of laser diffractometry, of 0.9 µm were ground for 3 hours in an attritor with the addition of 1.5 litres of isopropanol. The grinding beads were made of stabilized $Y_2O_3$. The bead-to-powder ratio was 6:1. The slurry so prepared was dried in vacuo and heated to 800° C. at a heating rate of 10 K/minute and then to 1050° C. at a heating rate of 2 K/minute. Heating was carried out under the action of $H_2$, the $H_2$ pressure being so adjusted that the $CH_4$ partial pressure, measured by mass spectrometry, in the temperature range 800° C. to 1050° C. was >15 mbar. The total pressure was approximately 1 bar. The reaction mixture was then heated to 1450° C. at a heating rate of 10 K/minute. The holding time at 1450° C. was 4.5 hours. Heating from 1050° C. to 1450° C. and holding at 1450° C. took place with the supply of dry hydrogen with a dewpoint <−40° C., the pressure being approximately 1 bar. Furnace cooling likewise took place under $H_2$ with a dewpoint <−40° C. The sinter cake was then broken into a powder. The powder so prepared had an aggregated and porous structure. Fine $Y_2O_3$ particles having a mean particle diameter <1 µm could be detected on the surface of the Cr-containing porous particles. Chemical analysis gave 291 µg/g C, 1320 µg/g O and 1128 µg/g Y, remainder Cr and conventional impurities. The porosity of the variant doped with $Y_2O_3$ was determined by means of quantitative image analysis, as described in detail in the description, circles and rectangles being used as the measure frames. The porosity of 10 particles was determined, the values being between 61% by volume and 75% by volume.

Figure 13:
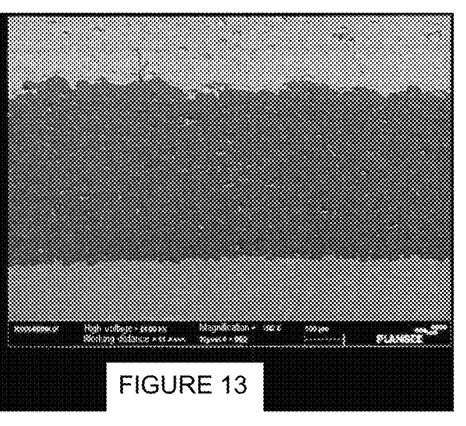
FIG. 13 shows a scanning electron microscope image of a GCS Cr—$Y_2O_3$ coating according to the invention, produced using the coating material according to the invention, deposited on an AlMg3 substrate according to Example 14.

The mean porosity was 67.1% by volume. Grain size fractions of <32 µm and 23-45 µm were produced by sieving, and spraying was carried out according to Example 2 with a type A installation. Dense, strongly adherent coatings having a thickness of approximately 400 µm (see FIG. 13) could again be produced.

The invention claimed is:

1. A coating material, comprising:
   Cr-containing particles having a Cr content >95% by mass;
   at least some of said Cr-containing particles having pores;
   said Cr-containing particles having a mean porosity of >10% by volume, said mean porosity determined by quantitative image analysis; and
   said Cr-containing particles having a mean surface area >0.05 m²g, measured by Brunauer-Emmett-Teller (BET) according to ISO 9277:1995.

2. The coating material according to claim 1, configured in powder form or granulate form.

3. The coating material according to claim 1, which comprises a material with a lower yield strength than Cr applied to a surface of said Cr-containing particles, at least in regions thereof.

4. The coating material according to claim 1, wherein said Cr-containing particles have a mean particle size $d_{50}$, measured by laser diffractometry, of 5 µm<d50<150 µm.

5. The coating material according to claim 1, comprising at least one component selected from the group consisting of carbides, borides, nitrides, and lubricants.

6. The coating material according to claim 1, the coating material comprising at least one further metal or being a constituent of a powder mixture.

7. The coating material according to claim 6, wherein said powder mixture has an MCrAlY alloy composition.

8. The coating material according to claim 1, wherein the Cr content is >50% by mass.

9. A process for producing a coating, the process comprising:
   providing the coating material according to claim 1; and
   producing a coating by cold gas spraying with the coating material.

10. The process according to claim 9, which comprises:
   a. providing a process gas having a pressure of from 10 to 100 bar and a temperature between room temperature and 1400° C.;
   b. accelerating the process gas in a convergent-divergent nozzle;
   c. injecting the coating material into the process gas upstream, in or downstream of the convergent-divergent nozzle;
   d. forming an adherent coating upon impact of the coating material on a substrate.

11. The process according to claim 10, wherein the process gas is nitrogen or a nitrogen-rich gas.

12. A coating, comprising:
   the coating material according to claim 1;
   the coating material forming the coating;
   the coating having a mean thickness >20 µm; and
   the coating having a microstructure containing at least partially deformed Cr-containing grains.

13. The coating according to claim 12, wherein the deformed Cr-containing grains are cold deformed.

14. The coating according to claim 12, wherein at least some of said grains are stretched in a direction parallel to a layer surface of the coating.

15. The coating according to claim 14, wherein said grains have a mean aspect ratio >1.3.

16. The coating according to claim 12, wherein the at least partially deformed Cr-containing grains have a mean nano-hardness $H_{IT}$ 0.005/5/1/5 of >4 GPa.

* * * * *